United States Patent
Wu et al.

(10) Patent No.: US 7,754,107 B2
(45) Date of Patent: Jul. 13, 2010

(54) CARBON NANOTUBE AND METHOD OF VISUALIZING CARBON NANOTUBE

(75) Inventors: Ning-Yu Wu, Hsinchu (TW); Yi-Yang Chen, Hsinchu (TW); Tri-Rung Yew, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 317 days.

(21) Appl. No.: 12/009,300

(22) Filed: Jan. 16, 2008

(65) Prior Publication Data

US 2008/0296538 A1     Dec. 4, 2008

(30) Foreign Application Priority Data

May 30, 2007  (TW) ................ 96119351 A

(51) Int. Cl.
*H01B 1/00*     (2006.01)
(52) U.S. Cl. .................. 252/510; 252/500; 252/502; 252/506; 252/511; 977/734; 977/740; 977/742; 977/745; 977/746; 977/753; 977/953; 423/445 B
(58) Field of Classification Search .......... 252/500, 252/502, 506, 510, 511; 977/734, 740, 742, 977/745, 753, 953; 423/445 R, 445 B
See application file for complete search history.

(56) References Cited

U.S. PATENT DOCUMENTS

| 2005/0045867 A1* | 3/2005 | Ozkan et al. ............... 257/12 |
| 2005/0272856 A1* | 12/2005 | Cooper et al. .............. 524/496 |
| 2006/0065887 A1* | 3/2006 | Tiano et al. ................ 257/20 |
| 2006/0221672 A1* | 10/2006 | Drndic et al. ............... 365/151 |

OTHER PUBLICATIONS

Landi et al. "Noncovalent attachment of CdSe quantum dots to single wall carbon nanotubes." Materials Let. vol. 60, pp. 3502-3506, Apr. 2006.*
Prakash et al. "Functionalization of carbon nanotubes with proteins and quantum dots in aqueous buffer solutions." App. Phys. Let. vol. 88, p. 063102-1-6, Feb. 2006.*
Sumio Lijima, "Helical mircotubules of graphitic carbon" 1991 Nature Publishing Group, Letters To Nature, vol. 354, Nov. 7, 1991, pp. 56-58.
JoAnne M. Haremza et al., "Attachment of Single CdSe Nanocrystals to Individual Single-Walled Carbon Nanotubes" 2002 American Chemical Society, Nano Letters, vol. 2, No. 11, pp. 1253-1258 (2002).

(Continued)

*Primary Examiner*—Mark Kopec
*Assistant Examiner*—Tri V Nguyen
(74) *Attorney, Agent, or Firm*—J.C. Patents

(57) ABSTRACT

A carbon nanotube is described, to which quantum dots are attached through non-covalent bonding via linking molecules bonded to the quantum dots. A method of visualizing a carbon nanotube is also described, wherein quantum dots are attached to the carbon nanotube through non-covalent bonding via linking molecules bonded to the quantum dots, and then the quantum dots are made emit light. This invention allows carbon nanotubes, even those in a wet condition, to be visualized by a simple fluorescent optical microscope. Thereby, the difficulties on preparing specimens and the need of sophisticated instruments can be reduced. This invention also exhibits great potential for the application of carbon nanotubes under a wet condition.

6 Claims, 8 Drawing Sheets

OTHER PUBLICATIONS

Sathyajith Ravindran et al., "Covalent Coupling of Quantum Dots to Multiwalled Carbon Nanotubes for Electronic Device Applications" 2003 American Chemical Society, Nano Letters, vol. 3, No. 4, pp. 447-453 (2003).

Sumit Chaudhary et al., "Fluorescence Microscopy Visualization of Single-Walled Carbon nanotubes Using Semiconductor Nanocrystals" 2004 American Chemical Society, Nano Letters, vol. 4, No. 12, pp. 2415-2419, (2004).

Naotoshi Nakashima et al., "Water-Soluble Single-Walled Carbon Nanotubes via noncovalent Sidewall-Functionalization with a Pyrene-Carrying Ammonium Ion" 2002 The Chemical Society of Japan, Chemistry Letters, Feb. 18, 2002, pp. 638-639.

Rober J. Chen et al., "Noncovalent Sidewall Functionalization of Single-Walled Carbon Nanotubes for Protein Immobilization" 2001 American Chemical Society, Chemical Society, vol. 123, No. 16, Apr. 14, 2001, pp. 3838-3839.

Warren C. W. Chan et al., "Quantum Dot Bioconjugates for Ultrasensitive nonisotopic Detection" Science, Sep. 25, 1998, vol. 281, pp. 2016-2018.

Weihong Zhu et al., "Fluorescent chromophore functionalized single-wall carbon nanotubes with minimal alteration to their characteristic on-dimensional electronic states" The Royal Society of Chemistry 2003, Journal of Materials Chemistry, vol. 13, pp. 2196-2201.

Jason E. Riggs et al., "Strong Luminescence of Solubilized Carbon nanotubes" 2000 American Chemical Society, Chemical Society, vol. 122, Jun. 2, 2000, pp. 5879-5880.

* cited by examiner

CARBON NANOTUBE AND METHOD OF VISUALIZING CARBON NANOTUBE

CROSS-REFERENCE TO RELATED APPLICATION

This application claims the priority benefit of Taiwan application serial no. 96119351, filed May 30, 2007. The entirety of each of the above-mentioned patent application is incorporated herein by reference and made a part of this specification.

BACKGROUND OF THE INVENTION

1. Field of the Invention

This invention relates to carbon nanotubes, and more particularly relates to a carbon nanotube attached with quantum dots through non-covalent bonding to become visualizable in an optical microscope, and to a method of visualizing a carbon nanotube.

2. Description of the Related Art

Since Iijima (*Nature* 1991, 354, 56) discovered carbon nanotubes (CNTs), the studies on the structures and electrical, mechanical and chemical properties thereof are much developed. However, for the size of CNT is in nanoscale, observation of CNT requires an expensive and operationally complicated instrument, such as atomic force microscope (AFM), transmission electron microscope (TEM) or scanning electron microscope (SEM). Meanwhile, the procedure of preparing a CNT specimen for the above microscopes is tedious. Moreover, using an electron microscope to observe CNTs tends to damage the structure thereof or even break them apart due to the high-energy electron beam, and is thus not an efficient and economical observation method.

Due to its structure and dimension, CNT has drawn much attention in the fields of biology and chemistry and has been utilized in the applications of medical micro-probes and sensors. However, for the applications are usually done in a wet condition, e.g., in a liquid solution, TEM or SEM is too sophisticated in use. The simplest and cheapest solution to the above issue is to use optical microscopes, while many optical observation methods for CNTs have been proposed recently. For example, a CNT can be attached with a fluorescent organic dye at its surface or covered by a fluorescent polymer so that it can be observed directly with a fluorescence optical microscope. However, the two methods have certain drawbacks. The luminescence lifetime of a fluorescent organic dye is quite short preventing long-term observation or labeling. Furthermore, the interaction between a fluorescent polymer and the surface charges of the CNT reduces the fluorescence of the polymer, or even eliminates the fluorescence to make the polymer lose its labeling function. To solve the issues, many recent studies focus on attaching quantum dots, instead of organic dyes or fluorescent polymers, to CNTs so that the CNTs can be easily labeled and observed in a wet condition.

A quantum dot is usually a semiconductor nanocrystal with a very long lifetime and a very high efficiency in the luminescence of which the luminescence color can be easily changed by adjusting the size thereof, thus being quite suitable for labeling. A quantum dot can be attached to a CNT through covalent or non-covalent bonding. Though forming a covalent bond firmly fixes the quantum dot on the surface of the CNT, the unique structure of the CNT has to be destroyed previously to form a dangling bond for linking the quantum dot, so that the unique properties of the CNT are affected. On the other hand, a non-covalent bonding method can retain the unique properties of a CNT, and can make the quantum dots uniformly attached to the CNT as not needing to form a covalent bond at a specific site on the CNT surface. However, the non-covalent bonding in the prior art is generally weaker making the quantum dots easily detached.

SUMMARY OF THE INVENTION

Accordingly, this invention provides a carbon nanotube that can be visualized in an optical microscope without destroying the unique structure thereof.

This invention also provides a method of visualizing a carbon nanotube without destroying the unique structure thereof.

The carbon nanotube of this invention is attached with quantum dots through non-covalent bonding via linking molecules bonded to the quantum dots.

In the method of visualizing a carbon nanotube of this invention, quantum dots with linking molecules bonded thereto are attached to the carbon nanotube through non-covalent bonding via the linking molecules, and the quantum dots are made emit light.

In some embodiments, the linking molecules are covalently bonded to the quantum dots. Such a linking molecule may include a polycyclic polyaromatic group having π-π interaction with a surface of the carbon nanotube to achieve the non-covalent bonding, and a group R covalently bonded between the polycyclic polyaromatic group and the surface of the quantum dot.

With the quantum dots attached to a carbon nanotube through non-covalent bonding, the carbon nanotube can be visualized in an optical microscope without destroying the unique structure of the carbon nanotube.

It is to be understood that both the foregoing general description and the following detailed description are exemplary, and are intended to provide further explanation of the invention as claimed.

DESCRIPTION OF THE PREFERRED EMBODIMENTS

Figure 1:
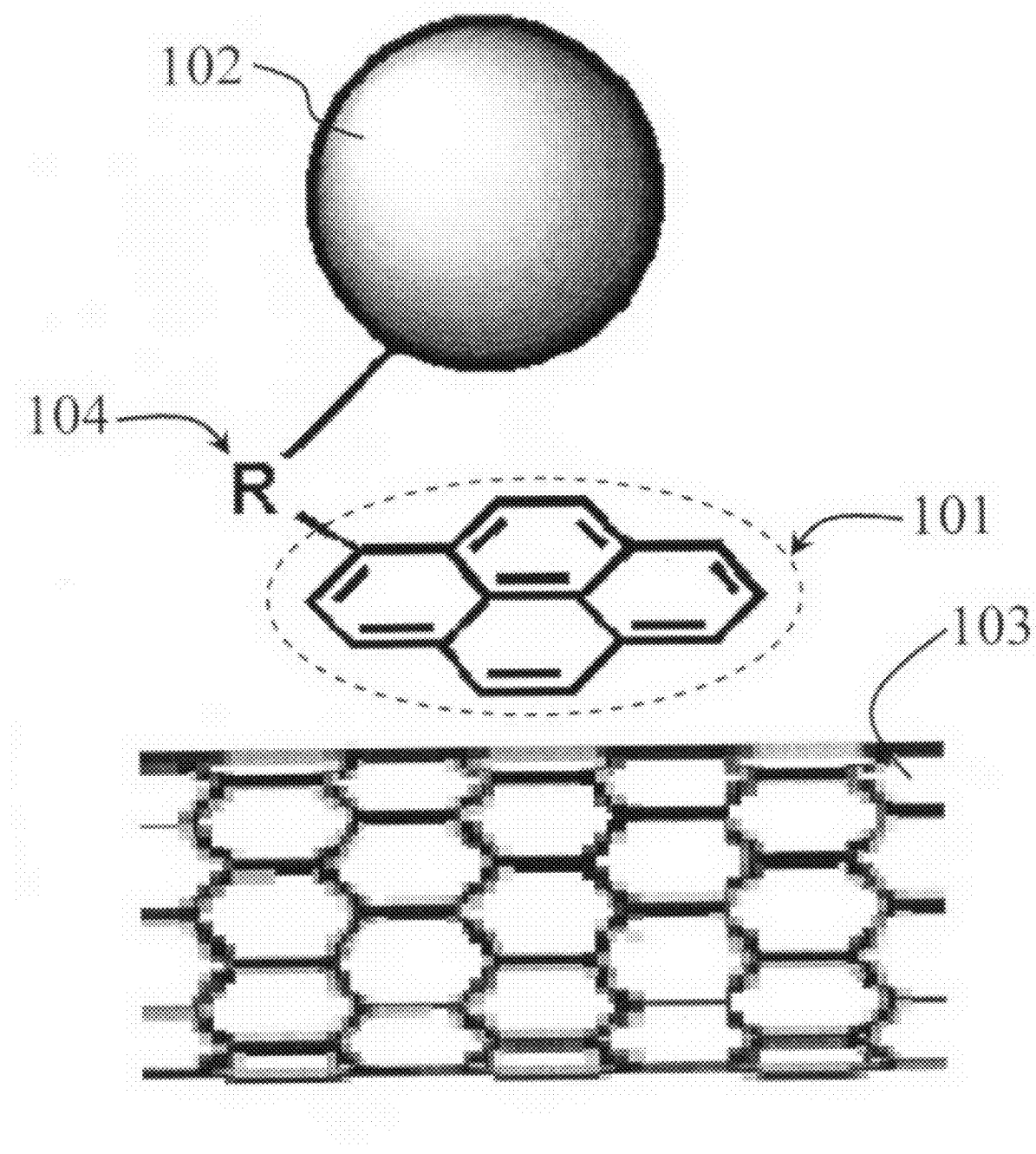
FIG. 1 schematically illustrates a carbon nanotube that is attached with a quantum dot through non-covalent bonding via a linking molecule covalently bonded to the quantum dot according to an embodiment of this invention.

FIG. 1 schematically illustrates a carbon nanotube attached with a quantum dot through non-covalent bonding via a linking molecule covalently bonded to the quantum dot according to an embodiment of this invention. The linking molecule has a pyrenyl group as a polycyclic polyaromatic group having π-π interaction with the surface of the carbon nanotube to achieve the non-covalent bonding. It is particularly noted that FIG. 1 with only one linking molecule covalently bonded to a quantum dot and with only one quantum dot attached to one carbon nanotube is just a simplified illustration. In real practice, there may be more than one linking molecules covalently bonded to a quantum dot and a number of such quantum dots attached to one carbon nanotube.

Referring to FIG. 1, the linking molecule includes a pyrenyl group 101 and a group R 104 bonded thereto, wherein the pyrenyl group 101 has π-π interaction with the surface of the CNT 103, and the group R 104 is covalently bonded between the pyrenyl group 101 and the surface of the quantum dot 102. The group R may be a divalent group formed from a group with one thiol group, such as —$(CH_2)_n$S— (R1) shown below, or a trivalent group formed from a group with two thiol groups, such as the group R2:

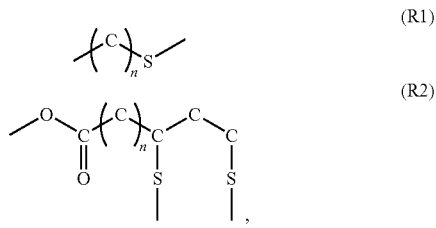

wherein "n" may be an integer of 0-20 and is preferably an integer of 7-9. The group R may alternatively be bonded at a position of the pyrenyl group other than the 1-position.

The pyrenyl group 101 has π-π interaction with a surface of the carbon nanotube 103, while the sulfur atom(s) of the group R 104 bonded to the pyrenyl group 101 forms one or two covalent bonds with the quantum dot 102, so that the quantum dot 102 is attached to the carbon nanotube 103 through non-covalent bonding.

For the length of the carbon chain "—$(CH_2)_n$—" in the group R, an "n" value in a wide range of 0-20 allows the sulfur atom(s) to be covalently bonded to the quantum dot 102. However, considering certain groups [e.g., $(CH_3(CH_2)_7)_3$PO—] on the surface of the quantum dot 102 causing steric hindrance, the "n" value preferably ranges from 7 to 9, because a group R with n=7-9 most easily overcomes the steric hindrance to reach the surface of the quantum dot 102 and form the covalent bond(s) with the same.

In addition, the quantum dot 102 may include a semiconductor material, which may include a transition metal chalcogenide. Specifically, the semiconductor material may include at least one transition metal chalcogenide selected from a group consisting of cadmium selenide (CdSe), cadmium sulfide, cadmium telluride, zinc selenide and zinc sulfide (ZnS). In an experiment example, the quantum dot 102 includes CdSe/ZnS. The quantum dot 102 may have a diameter between 1 nm and 20 nm.

The carbon nanotube 103 may be a single-walled carbon nanotube, a double-walled carbon nanotube or a multi-walled carbon nanotube that is known in the prior art and not shown in the figure. The carbon nanotube 103 may be electrically conductive or semiconductive. The two ends of the carbon nanotube 103 may independently be open or capped, which is also known in the prior art and not shown therefore.

It is particularly noted that when the carbon nanotube 103 is semiconductive, the quantum dot-attached carbon nanotube (103+102) may serve as a solar microcell.

Figure 2:
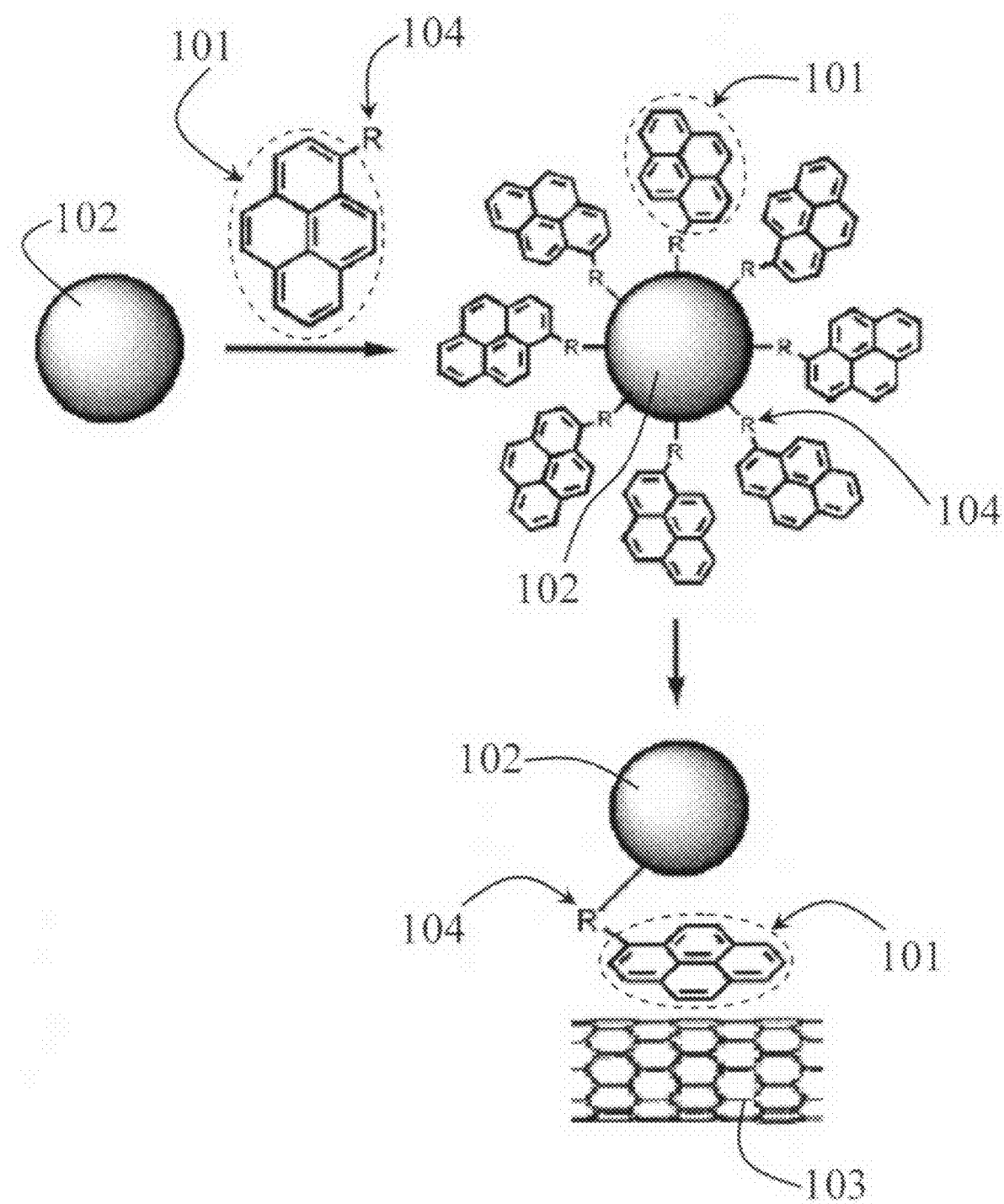
FIG. 2 schematically illustrates a process of attaching a quantum dot to a carbon nanotube through non-covalent bonding according to the embodiment of this invention.

Regardless of the species of the linking molecule, the quantum dot 102 may be attached to the carbon nanotube 103 with two steps. FIG. 2 illustrates such a process according to the embodiment of this invention.

Referring to FIG. 2, the first step is to modify the surface of the quantum dot 102. The unmodified quantum dot 102 and the linking molecules with a group R 104 capable of reacting with the surface of the quantum dot 102 are mixed, so that the linking molecules (101+104) are covalently bonded onto the surface of the quantum dot 102. For example, when the quantum dot 102 has a core/shell structure, such as a CdSe-core/ZnS-shell structure, and the group R 104 has a mercapto group at its end, the mercapto group reacts with a zinc atom in the shell of the quantum dot 102 to form a covalent bond so that the quantum dot 102 has many pyrenyl groups on its surface. The quantum dots 102 with pyrenyl groups 101 thereon are then mixed with the carbon nanotubes 103, wherein a quantum dot 102 self-attaches to the surface of a carbon nanotube 103 through electrostatic non-covalent bonding. Thereby, a quantum dots-carbon nanotube (QDs-CNT) complex is formed.

After the quantum dots 102 are attached to the CNT 103 through non-covalent bonding via the pyrenyl groups 101 thereon, the quantum dots 102 are made emit light so that the CNT 103 is visible in an optical microscope. For example, in a fluorescent optical microscope, the quantum dots 102 attached to the carbon nanotube 103 are excited with a specific wavelength according to the absorption of the quantum dots to emit visible fluorescent light and thereby the carbon nanotube 103 is visualized.

EXAMPLES

Synthesis Example 1

Synthesis of Linking Molecule "(1-pyrenyl)-R"
[R=R1+1H, n=1→R=—$CH_2SH$]

An exemplary synthesis of the linking molecule "(1-pyrenyl)methanethiol" is shown in the following Scheme 1, which replaces the —OH group with a mercapto group by three main steps including bromination, acetylthiolation and deacetylation. In the bromination step, (1-pyrenyl)methanol is reacted with $PBr_3$ to remove the —OH group and form (1-pyrenyl)bromomethane. In the thioacetylation step, (1-pyrenyl)bromo-methane is reacted with potassium thioacetate ($CH_3COSK$) to remove bromine and form (1-pyrenyl)methyl thioacetate of which the acetyl group is a good leaving group and is easily removed in a basic condition such as a LiOH solution. The product obtained can be protonated with HCl. A real synthesis process is described below.

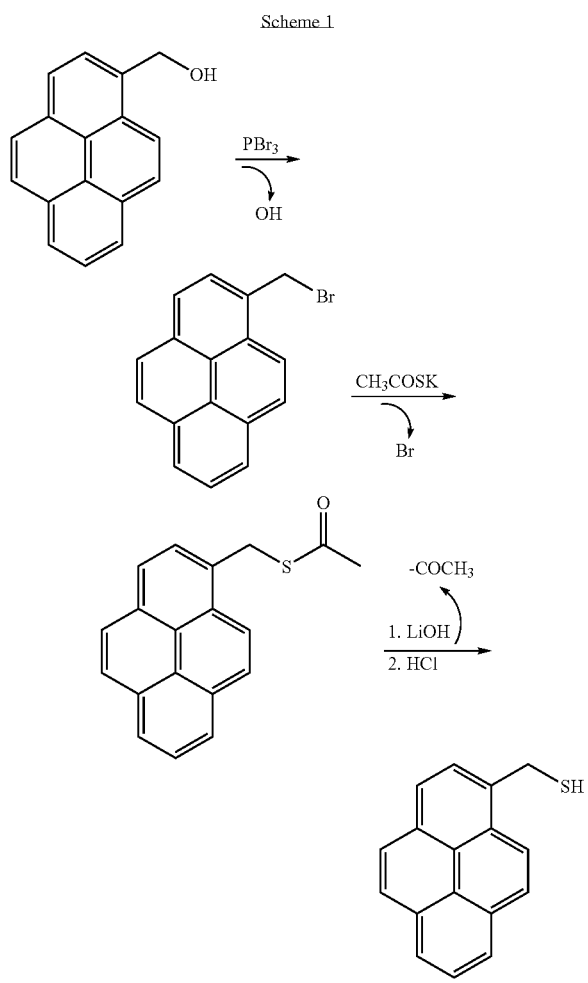

Scheme 1

Figure 3A:
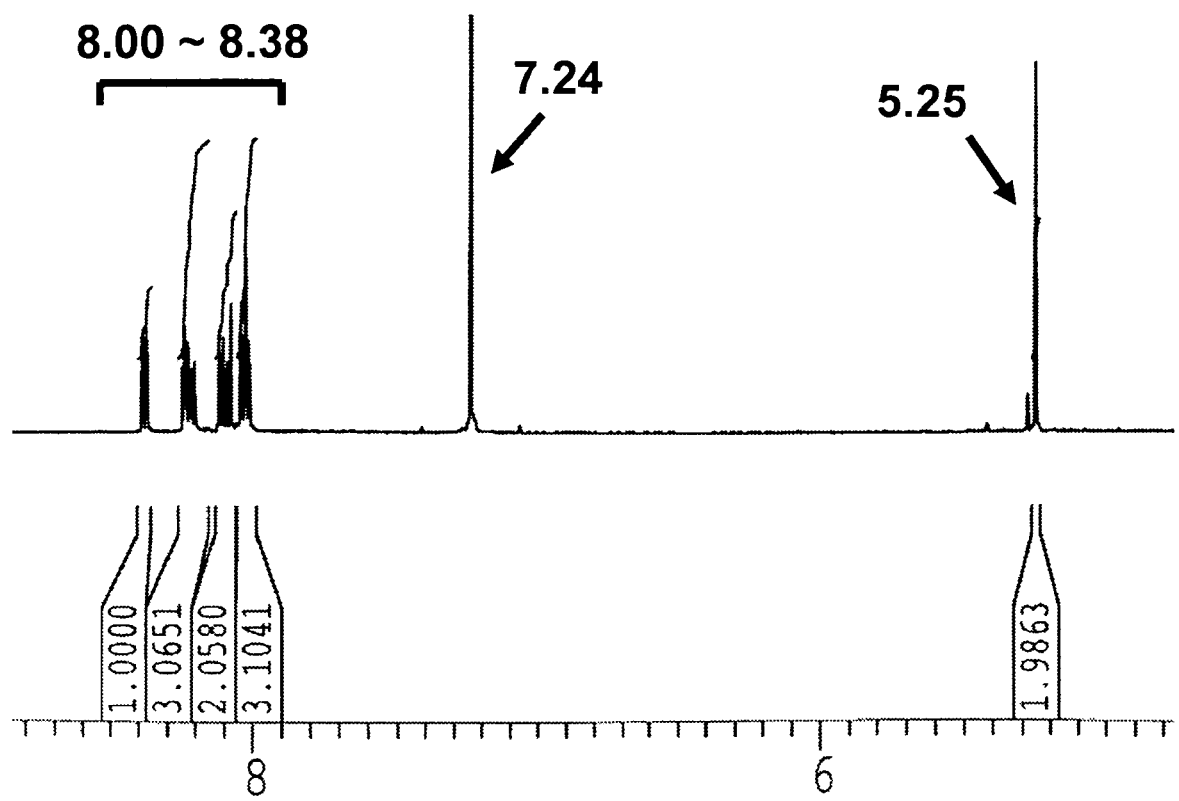
FIG. 3A is the $^1$H-NMR spectrum of the product [(1-pyrenyl)bromomethane] of the bromination of (1-pyrenyl)methanol in Synthesis Example 1 of this invention.

Firstly, 500 mg of (1-pyrenyl)methanol as the starting material was dissolved in 20 mL of dehydrated dichloromethane, and then 1 mL of $PBr_3$ was slowly dropped into the solution that was kept in an ice bath of 0° C. in an $N_2$-atmosphere. After 12 hours of stirring with a magnetic stirrer, the mixture was neutralized with 50 ml of 0.3M sodium bicarbonate solution (4 g/150 mL) three times using a separating funnel, and then $CH_2Cl_2$ was used to extract the organic phase in the mixture. After the moisture in the organic phase was removed by anhydrous $MgSO_4$, the solvent in the organic phase was removed under a reduced pressure to obtain 547 mg of (1-pyrenyl)bromomethane in a high purity. The completion of the bromination was confirmed by the $^1$H-NMR spectrum of the product in FIG. 3A and the mass spectrum (molecular weight=295.17) of the same.

Figure 3B:
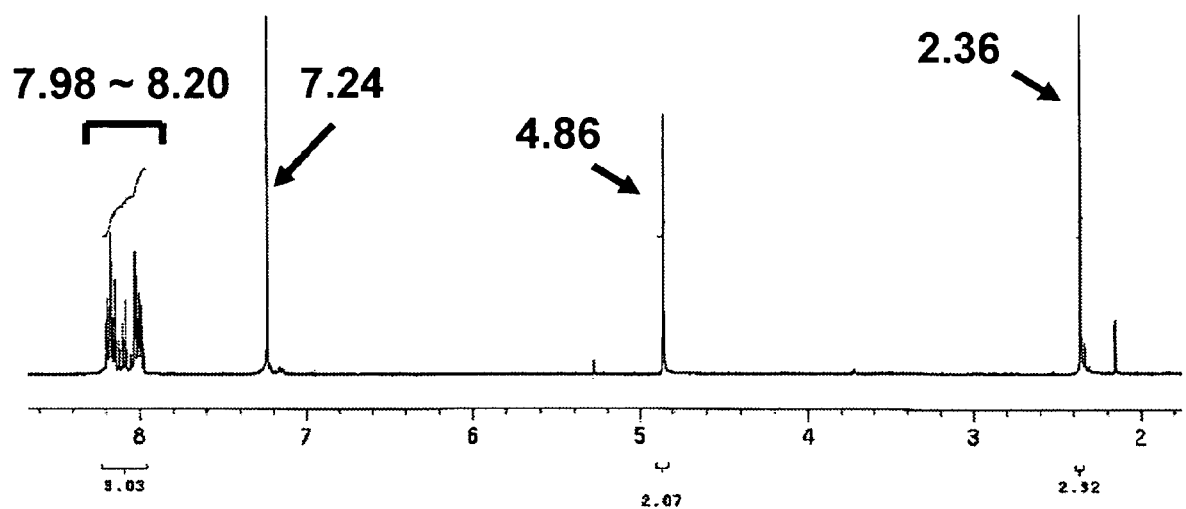
FIG. 3B is the $^1$H-NMR spectrum of the product [(1-pyrenyl)methyl thioacetate] of the acetylthiolation of (1-pyrenyl) bromomethane in Synthesis Example 1.

Then, 540 mg of (1-pyrenyl)bromomethane was added in 20 mL of tetrahydro-furan (THF), and 20 mL of deionized (DI) water and 420 mg of $CH_3COSK$ in a molar ratio of 2:1 relative to (1-pyrenyl)bromomethane added in the solution in sequence. The solution was refluxed at 80° C. for 12 hours, and then chloroform was used to extract the organic phase. After the moisture in the organic phase was removed by anhydrous $MgSO_4$, a vacuum condenser was used to remove the solvent in the organic phase, and then the product was purified with column chromatography using a 1:10 ethyl acetate/hexane mixture as an eluent to obtain 510 mg of (1-pyrenyl)methyl thioacetate. The completion of the acetylthiolation reaction was confirmed by the $^1$H-NMR spectrum of the product in FIG. 3B and the mass spectrum (molecular weight=290.38) of the same.

Figure 3C:
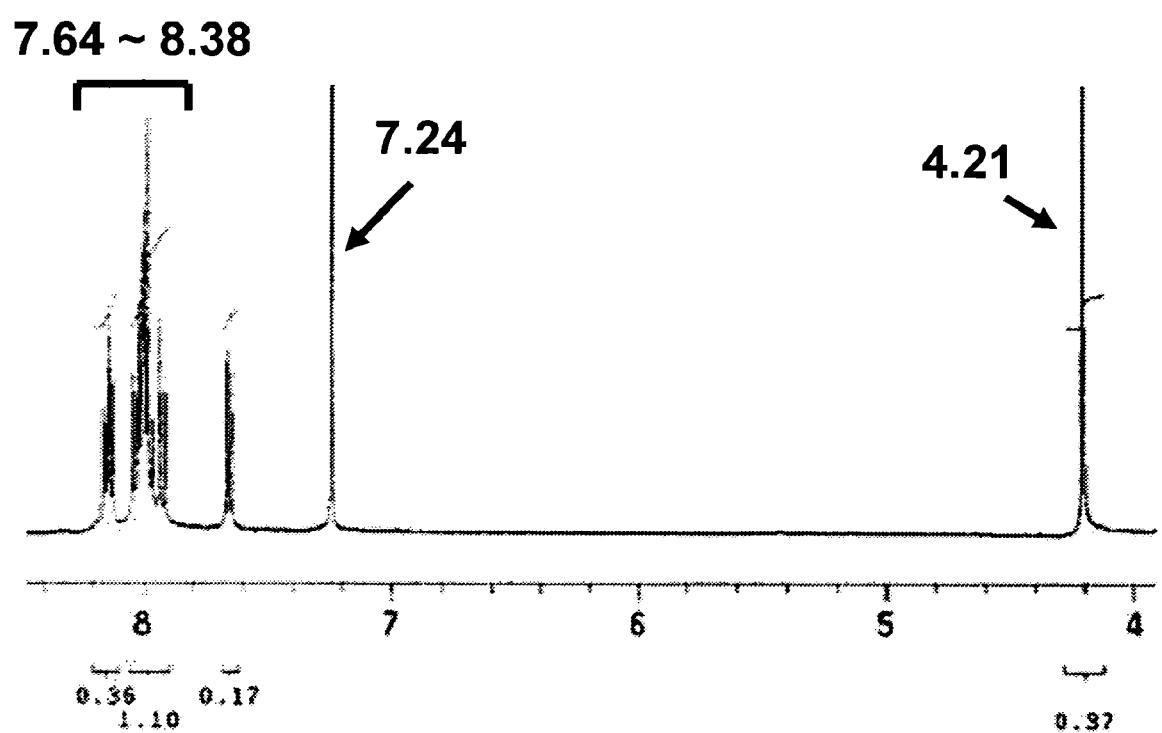
FIG. 3C is the $^1$H-NMR spectrum of the product [(1-pyrenyl)methanethiol] of the deacetylation of (1-pyrenyl)methyl thioacetate in Synthesis Example 1.

Then, 500 mg of (1-pyrenyl)methyl thioacetate was dissolved in 20 mL of THF and 20 mL of methanol, and 210 mg of lithium hydroxide in a molar ratio of 5:1 relative to (1-pyrenyl)methyl thioacetate was added. The solution was refluxed at 70° C. in a nitrogen atmosphere and stirred for 3 hours. After the solution was cooled to room temperature, the pH value of the solution was adjusted to 1, and then chloroform was used to extract the organic phase. After the moisture in the organic phase was removed by anhydrous $MgSO_4$, the solvent in the organic phase was removed under a reduced pressure. After a large amount of hexane was used to wash the reddish-brown viscous material away, the hexane was removed by the vacuum condenser to get 346 mg of a product, which was characterized as (1-pyrenyl)methanethiol by the $^1$H-NMR of the product in FIG. 3C and the mass spectrum (molecular weight=248.34) thereof.

Synthesis Example 2

Synthesis of the Linking Molecule "(1-pyrenyl)-R"
[R=R2+2H, n=4→R=OC(=O)(CH$_2$)$_4$CH(SH)CH$_2$CH$_2$SH]

An exemplary synthesis of the linking molecule "(1-pyrenyl)methyl 6,8-dimercaptooctanoate" is shown in the following Scheme 2, wherein an esterification reaction of (1-pyrenyl)methanol and thioctic acid is performed to form (1-pyrenyl)-methyl 5-(1,2-dithiolan-3-yl)pentanoate. A reduction reaction is then conducted to break the S—S bond and form two mercapto groups. A real synthesis process done by the Inventors is described below.

Scheme 2

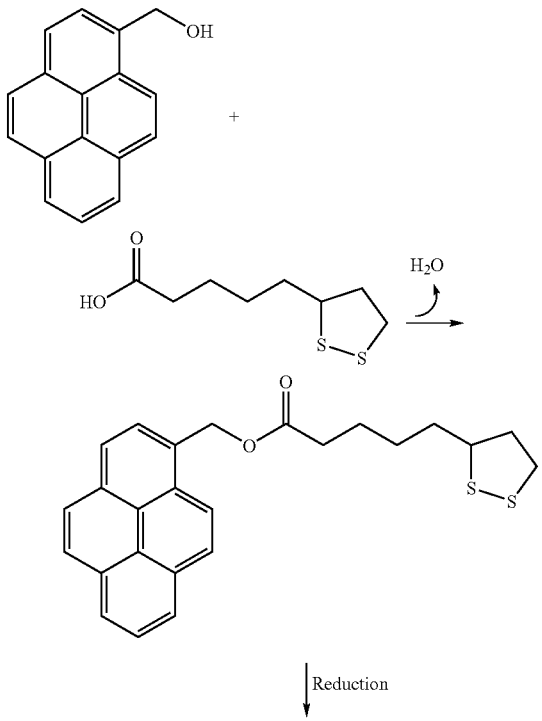

-continued

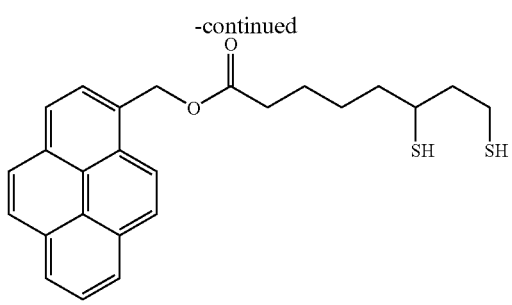

Figure 4:
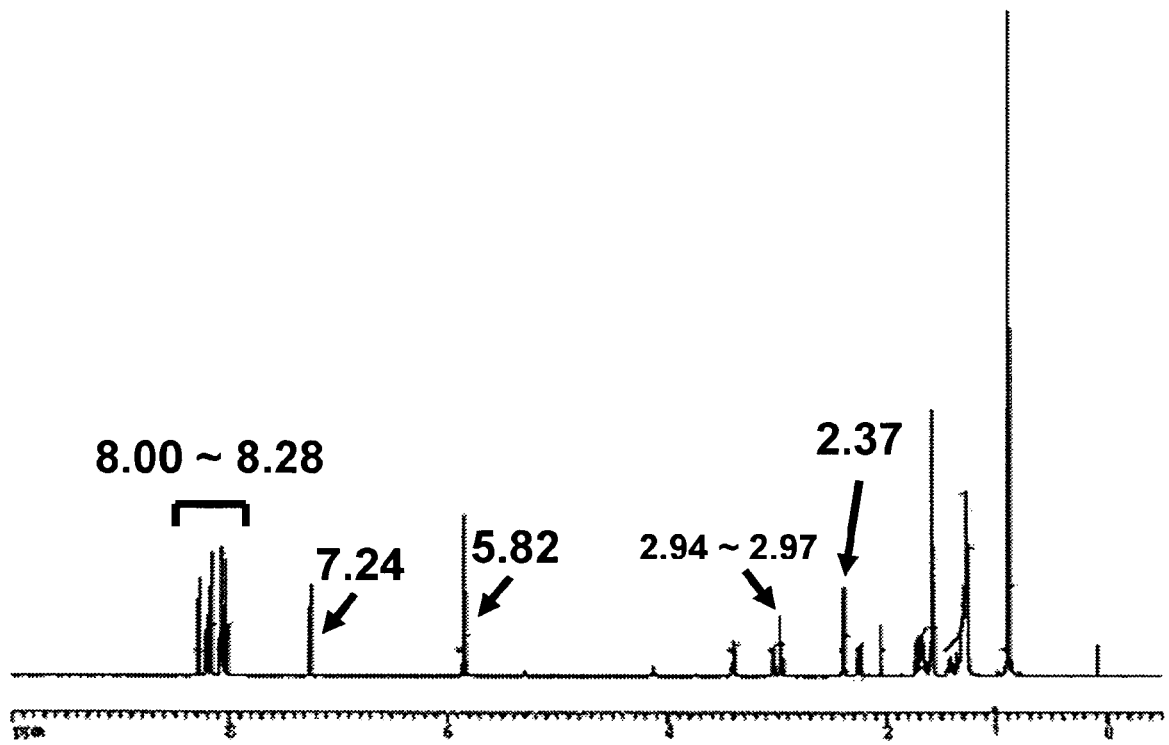
FIG. 4 is the $^1$H-NMR spectrum of the product (1-pyrenemethyl 5-(1,2-dithiolan-3-yl)pentanoate) of the esterification reaction of (1-pyrenyl)methanol and thiotic acid in Synthesis Example 2 of this invention.

First, 500 mg of thiotic acid and 370 mg of (1-pyrenyl) methanol in a molar ratio of 1:1.2 were co-dissolved in 20 mL of dehydrated dichloromethane. The solution was stirred with a magnetic stirrer in an ice bath of 0° C. in a nitrogen atmosphere for 30 min, and then 400 mg of dicyclohexylcarbodiimide (DCC) and 10 mg of dimethylamino-pyridine (DMAP) were added and the stirring was continued for 30 min. The ice bath was then removed, and the solution was further stirred at room temperature for 6 hours. The organic phase in the solution was extracted with chloroform and dehydrated with anhydrous $MgSO_4$, the solvent in the organic phase is removed under a reduced pressure, and then the product was purified through column chromatography using a 1:5 ethyl acetate/hexane mixture as an eluent. The completion of the esterfication reaction was confirmed with the $^1$H-NMR spectrum of the product in FIG. 4 and the mass spectrum (molecular weight=420.59) of the same.

Thereafter, 500 mg of (1-pyrenyl)methyl 5-(1,2-dithiolan-3-yl)pentanoate was dissolved in DI water, 30 mg of $NaBH_4$ was added, and the solution was stirred for 30 min at room temperature. The organic phase in the mixture solution was extracted by chloroform and dehydrated by anhydrous $MgSO_4$, and then the organic solvent in the organic phase was removed leaving (1-pyrenyl)methyl 6,8-dimercaptooctanoate as a linking molecule. Because the $^1$H-NMR spectrum thereof was similar to that before the reduction reaction and the reverse reaction occurred readily, the product was not characterized but directly used to form covalent bonds with the quantum dots.

Experiment Example 1

Formation of Quantum Dots-Carbon Nanotube Complex

In this example, 25 mg of the linking molecule (1-pyrenyl)-R(R=R1+1H or R2+2H) was dissolved in 10 mL of chloroform, and then the resulting solution was mixed with a chloroform solution of 10 mg of CdSe/ZnS quantum dots, wherein the molar ratio of the linking molecule to the quantum dots was about 1:1. However, in general cases, the molar ratio may be set at any value in the range approximately between 1:10 and 100:1. The mixed solution was refluxed at 50° C. in a light-free condition and stirred for 12 hours, and then cooled to room temperature to complete the preparation of CdSe/ZnS quantum dots with pyrenyl groups covalently bonded thereto via the group R of the linking molecule.

The CdSe/ZnS quantum dots with pyrenyl groups thereon were added into a solution with carbon nanotubes dispersed therein, and then the mixture is stirred by a magnetic stirrer for 30 min to make the quantum dots attach to the carbon nanotubes.

Figure 5A:
FIG. 5A shows the images of carbon nanotubes attached with quantum dots in an ordinary optical microscope (a) and a fluorescent optical microscope (b), respectively, in Experiment Example 1 of this invention.
Figure 5A:
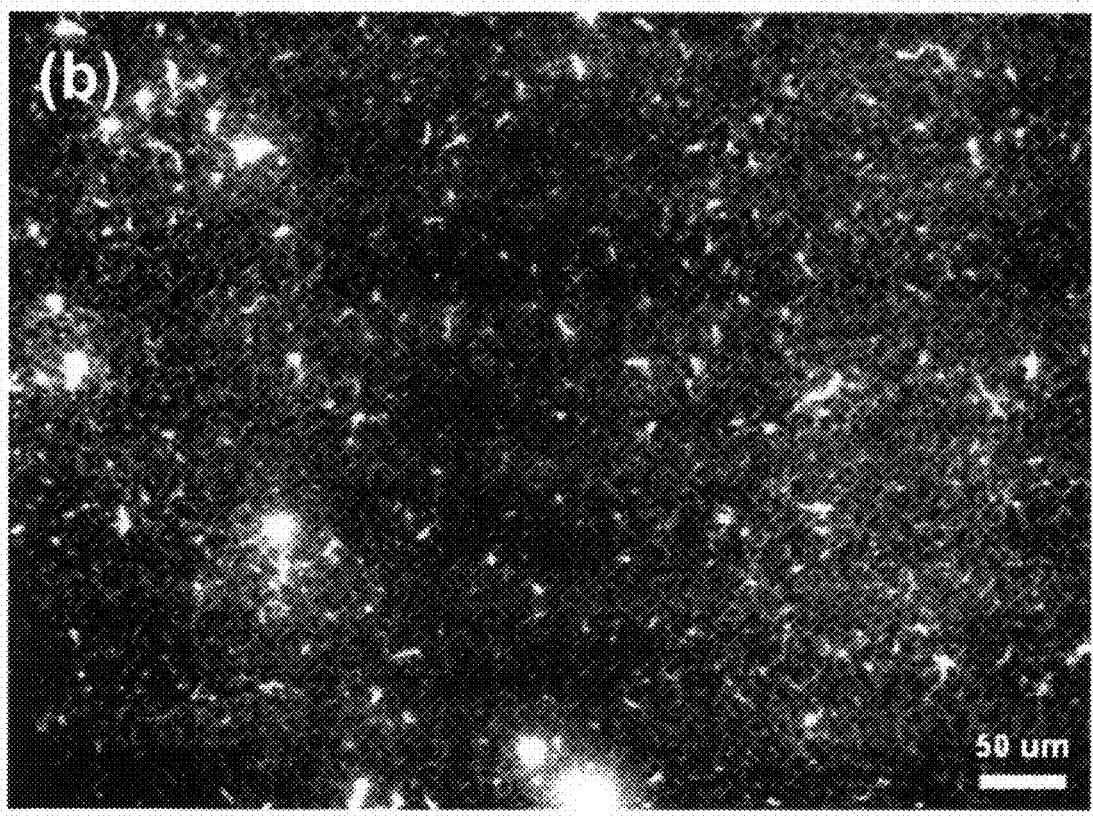

FIG. 5A shows the images of the carbon nanotubes processed as above in an ordinary optical microscope (a) and a fluorescent optical microscope (b), respectively, in Experiment Example 1 of this invention. The attachment of quantum dots to the carbon nanotubes was confirmed by FIG. 5A(b), for the carbon nanotubes originally invisible in the fluorescent optical microscope were visualized after the fluorescent quantum dots were added.

Figure 5B:
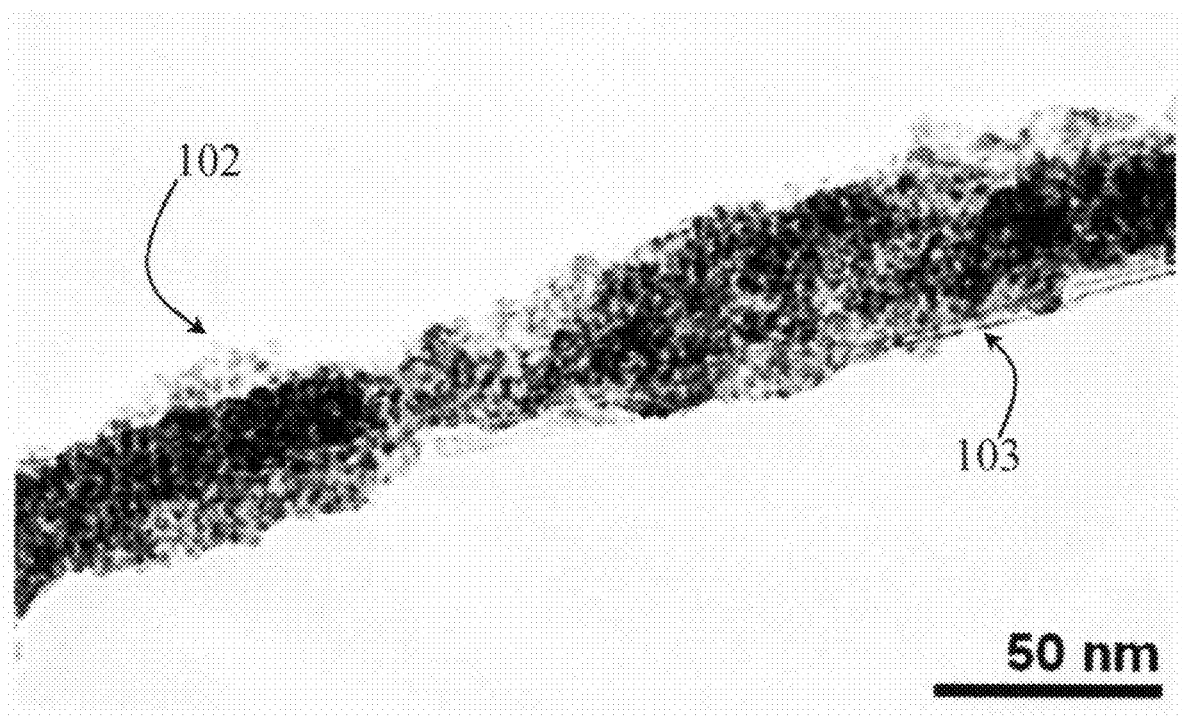
FIG. 5B shows a TEM image of carbon nanotubes attached with quantum dots in Experiment Example 1 of this invention.

For further demonstration, FIG. 5B shows a TEM image of the carbon nanotubes processed as above in Experiment Example 1 of this invention. It is clear that the quantum dots (102) were truly attached to the carbon nanotubes (103).

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of visualizing a carbon nanotube, comprising:
   bonding a plurality of linking molecules to surfaces of a plurality of quantum dots;
   attaching the quantum dots to the carbon nanotube through non-covalent bonding via the linking molecules, wherein the linking molecule is (1-pyrenyl)methyl 6,8-dimercaptooctanoate; and
   making the quantum dots emit light.

2. The method of claim 1, wherein the quantum dots comprise a semiconductor material.

3. The method of claim 2, wherein the semiconductor material comprises a transition metal chalcogenide.

4. The method of claim 3, wherein the semiconductor material comprises at least one transition metal chalcogenide selected from the group consisting of cadmium selenide, cadmium sulfide, cadmium telluride, zinc selenide and zinc sulfide.

5. The method of claim 4, wherein the semiconductor material comprises CdSe/ZnS.

6. The method of claim 1, wherein the quantum dots have a diameter between 1 nm and 20 nm.

* * * * *